US008798211B2

(12) United States Patent
Qiu et al.

(10) Patent No.: US 8,798,211 B2
(45) Date of Patent: Aug. 5, 2014

(54) CHANNEL-SENSITIVE POWER CONTROL

(71) Applicants: James Qiu, Carlsbad, CA (US); Sridhar Ramesh, Carlsbad, CA (US); Sheng Ye, Carlsbad, CA (US); Curtis Ling, Carlsbad, CA (US)

(72) Inventors: James Qiu, Carlsbad, CA (US); Sridhar Ramesh, Carlsbad, CA (US); Sheng Ye, Carlsbad, CA (US); Curtis Ling, Carlsbad, CA (US)

(73) Assignee: MaxLinear, Inc., Carlsbad, CA (US)

( * ) Notice: Subject to any disclaimer, the term of this patent is extended or adjusted under 35 U.S.C. 154(b) by 0 days.

(21) Appl. No.: 13/845,377

(22) Filed: Mar. 18, 2013

(65) Prior Publication Data
US 2013/0216009 A1 Aug. 22, 2013

Related U.S. Application Data

(63) Continuation of application No. 12/799,378, filed on Apr. 23, 2010, now Pat. No. 8,442,154.

(60) Provisional application No. 61/214,446, filed on Apr. 23, 2009.

(51) Int. Cl.
H04L 27/06 (2006.01)
H03G 3/20 (2006.01)
H04L 1/20 (2006.01)
H04B 1/10 (2006.01)
H04W 52/02 (2009.01)

(52) U.S. Cl.
CPC .. H03G 3/20 (2013.01); H04L 1/20 (2013.01); Y02B 60/50 (2013.01); H04B 1/109 (2013.01); H04W 52/0245 (2013.01)
USPC .......................................... 375/344; 375/340

(58) Field of Classification Search
USPC .......................... 375/344–345, 326–327, 340
See application file for complete search history.

(56) References Cited

U.S. PATENT DOCUMENTS

| 4,251,782 | A  | * | 2/1981  | Bynum ........................... 333/18 |
| 6,052,566 | A  | * | 4/2000  | Abramsky et al. ......... 455/67.11 |
| 6,295,445 | B1 | * | 9/2001  | Uesugi ....................... 455/234.1 |
| 6,480,142 | B1 | * | 11/2002 | Rubin ........................ 342/26 R |
| 6,532,358 | B1 | * | 3/2003  | Earls et al. .................. 455/234.1 |
| 7,181,184 | B1 | * | 2/2007  | Dimeo et al. ................. 455/296 |
| 7,299,021 | B2 | * | 11/2007 | Pärssinen et al. .......... 455/226.1 |
| 7,375,676 | B1 | * | 5/2008  | Loberger ..................... 342/160 |
| 2002/0000948 | A1 | * | 1/2002  | Chun et al. ................... 343/853 |
| 2003/0064695 | A1 | * | 4/2003  | Shi ............................... 455/302 |
| 2004/0172148 | A1 | * | 9/2004  | Horibe .......................... 700/94 |
| 2005/0147192 | A1 | * | 7/2005  | Yamamoto et al. .......... 375/345 |
| 2006/0040617 | A1 | * | 2/2006  | Haub et al. ................ 455/67.13 |
| 2006/0058027 | A1 | * | 3/2006  | Fang et al. .................... 455/434 |
| 2006/0281432 | A1 | * | 12/2006 | Isaac et al. .................... 455/323 |
| 2007/0129034 | A1 | * | 6/2007  | Adams et al. ................. 455/138 |
| 2008/0153447 | A1 | * | 6/2008  | Cowley et al. ................ 455/296 |
| 2008/0181337 | A1 | * | 7/2008  | Maxim ......................... 375/340 |
| 2008/0187078 | A1 | * | 8/2008  | Hong et al. ................... 375/350 |
| 2009/0112096 | A1 | * | 4/2009  | Tamura ......................... 600/454 |
| 2009/0141775 | A1 | * | 6/2009  | Kober et al. .................. 375/148 |
| 2009/0180578 | A1 | * | 7/2009  | Chang et al. ................. 375/345 |
| 2011/0037650 | A1 | * | 2/2011  | Lennen ...................... 342/357.63 |
| 2014/0029649 | A1 | * | 1/2014  | Candell et al. ................ 375/148 |

* cited by examiner

Primary Examiner — Emmanuel Bayard
(74) Attorney, Agent, or Firm — McAndrews, Held & Malloy, Ltd.

(57) ABSTRACT

A communication receiver which applies signal processing for quantitatively estimating receive signal factors such as communication channel quality, signal characteristics, and overall system received bit error rate (BER) or packet error rate (PER) and which applies a general algorithm for mapping these estimated factors to control receiver performance and minimize power consumption.

16 Claims, 5 Drawing Sheets

CHANNEL-SENSITIVE POWER CONTROL

CROSS-REFERENCE TO RELATED APPLICATIONS/INCORPORATION BY REFERENCE

This application is a continuation of U.S. application Ser. No. 12/799,378, filed Apr. 23, 2010, which claims the benefit of U.S. Provisional Application No. 61/214,446, filed Apr. 23, 2009. The above-referenced United States patent applications are all hereby incorporated herein by reference in their entirety.

BACKGROUND OF THE INVENTION

1. Field of the Invention

The invention relates to an architecture and methods for a communication receiver to adjust consumed power according to the received signal condition, and more particularly to techniques and algorithms for controlling receiver performance and power consumption as a function of a number of receive signal factors.

2. Description of the Related Art

Communication systems typically face a range of signal conditions, including communication channel quality as well as the transmitted modulation scheme and code rate which may vary with time and make the desired signal easier or harder to receive. These different conditions require different levels of performance for satisfactory reception of the signal; in well-designed systems, higher performance generally requires more power consumption. Conventional communication systems do not account for these variations by trading off power consumption for system performance when the signal becomes easier to receive. In fact, the minimum performance of the system required to receive the desired signal ("minimum required performance", or MRP) can vary quite a bit, depending on the aforementioned characteristics.

U.S. Patents and a U.S. Patent Application relating to the present invention are:

U.S. Pat. No. 7,457,607 (Krivokapic) teaches minimization of mobile station power consumption through dynamic optimization of amplifier linearity and frequency synthesizer single sideband phase noise across a wide range of input signal levels and gain settings.

U.S. Pat. No. 7,229,021 (Parssinen et al.) describes an apparatus, a method and an algorithm for controlling the dynamic range of a radio receiver. The invention provides a monitoring circuit and associated logic to control the dynamic range of a radio receiver based on several parameters making it possible to continuously optimize the receiver performance.

U.S. Patent Application 2008/0080597 (Rofougaran) teaches a radio transceiver that optimizes power consumption by selectively attenuated interferers. Optimizing power consumption involves comparing the transmit power level with two or three thresholds. Depending on the outcome, the blocking circuit is either disabled, enabled or the system increases the linearity of the low noise amplifier, the blocking circuit and other parameters.

It should be noted that none of the above-cited examples of the related art provide the advantages of the below described invention.

SUMMARY OF THE INVENTION

It is an object of at least one embodiment of the present invention to provide for a communication receiver a system for quantitatively estimating each of receive signal factors, and a general algorithm for mapping these estimated receive signal factors to settings for receiver performance parameters to minimize power under these conditions.

It is another object of the present invention to determine these receive signal factors such as communication channel quality, signal characteristics, and overall system received bit error rates or packet error rates.

It is yet another object of the present invention to trade off, as the receive signal factors vary, receiver performance parameters such as RF dynamic range, baseband dynamic range, channel equalization performance, system phase noise, and channel decoder performance.

It is still another object of the present invention to provide more linearity when strong undesired signals ("blockers") are present at frequencies close to the desired signal's frequency.

It is a further object of the present invention is to include, in the reception of wireless signals in a mobile environment, signal processing in the receiver which counteracts the effects of changing channel conditions.

It is yet a further object of the present invention is to gauge how much excess performance the system has over and above the minimum required performance.

It is still a further object of the present invention is to provide a feedback mechanism during the adjustment of the receiver performance parameters.

These and many other objects have been achieved by providing a receiver front end circuit which processes the received signal and then passes it on to a signal strength detectors circuit which analyzes the signal strength. The Receive Signal Factors estimator then processes that information and passes it on to the receiver performance parameters control which combines the information and adjusts the power consumption of the receiver front end circuits.

BRIEF DESCRIPTION OF THE DRAWINGS

Use of the same reference number and letters in different figures indicates similar or like elements.

DESCRIPTION OF THE PREFERRED EMBODIMENT

The goal of this invention is to optimize receiver power consumption as a function of signal conditions, adapting the receiver's performance (and hence its power consumption) when signal conditions make the desired signal easier or more difficult to receive.

The preferred embodiment of the present invention comprises a set of techniques and algorithms for controlling receiver performance and power consumption as a function of the following receive signal factors (which we refer to as "factors", or RSF):

1. Communication channel quality
    a. Presence, magnitude, and specific frequency location of blockers,
    b. Doppler frequency,
    c. Fading conditions such as the presence of multipath,
    d. Signal to noise ratio and signal strength of the desired signal.
2. Signal characteristics
    a. Modulation scheme being received, such as OFDM or 16QAM,
    b. Code rate received, such as convolutional coding or rate 2/3.
3. Overall system received bit error rate (BER) or packet error rate (PER).

The receiver performance parameters ("parameters", or RPP) that are traded off as the receive signal factors vary include the following:

1. RF dynamic range,
2. Baseband dynamic range including signal path noise and bandwidth,
3. Channel equalization performance,
4. System phase noise,
5. Channel decoder performance.

The invention comprises a system for quantitatively estimating each of the factors, and a general algorithm for mapping these estimated factors to settings for the receiver performance parameters to minimize power under these conditions.

1. Presence, Magnitude, And Specific Frequency Location Of Blockers

Figure 1:
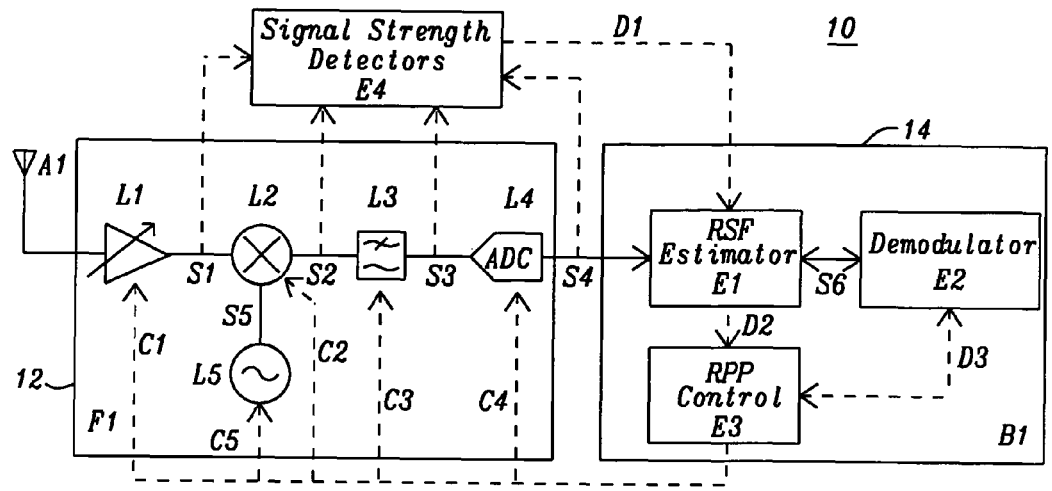
FIG. 1 is a block diagram of the channel-sensitive power control according to a preferred embodiment of the present invention.

In a preferred embodiment of the present invention as shown in FIG. 1, we describe an embodiment of the Channel-Sensitive Power Control 10. The Channel-Sensitive Power Control 10 comprises a Receiver Front End F1 (12) and a Back End B1 (14). Receiver Front End F1 typically comprises blocks L1, L2, L3, L4, and L5. Back End B1 typically comprises blocks E1, E2, and E3.

L1 is an amplifier which typically has low noise and variable gain. L1 may also perform filtering and attenuation functions.
L2 is a mixer for performing frequency conversion of the received signal.
L3 is a filter which may also have variable gain control.
L4 is a data converter to convert S3 from analog to digital domain.
L5 is a frequency synthesizer block.
E4 senses the signal levels out of each block L1-L4.

Together, L1-L4 select a signal received by antenna A1, amplify, filter, frequency-convert, and data-convert the signal so that it can be demodulated or otherwise processed by other systems.

Signals received by antenna A1 are passed on to a low-noise variable gain amplifier L1 of F1. L1 feeds via signal S1 the mixer L2, L2 feeds via signal S2 the baseband amplifier L3, and L3 feeds via signal S3 the analog-to-digital converter (ADC) L4. The output of L4 is digital signal S4 named "received signal". Synthesizer L5 (local oscillator LO) couples via signal S5 to L2. Signals S1, S2, S3, and S4 (dashed lines) feed the Signal Strength Detectors block E4. Signal S4 also feeds RSF estimator E1 of Back End B1. E1 also receives signal D1 (dashed lines) generated by E4. E1 and Demodulator E2 are coupled via 2-way signal S6, E1 also feeds via signal bus D2 (dashed lines) the RPP Control E3. Demodulator E2 and RPP Control E3 are coupled via 2-way signal D3 (dashed lines). The output of RPP Control E3 couples to Receiver Front End F1 via block control signals C1, C2, C3, C4, and C5 (dashed lines). Signal C1 feeds L1, signal C2 feeds L2, signal C3 feeds L3, signal C4 feeds L4, and signal C5 feeds L5.

Figure 2:
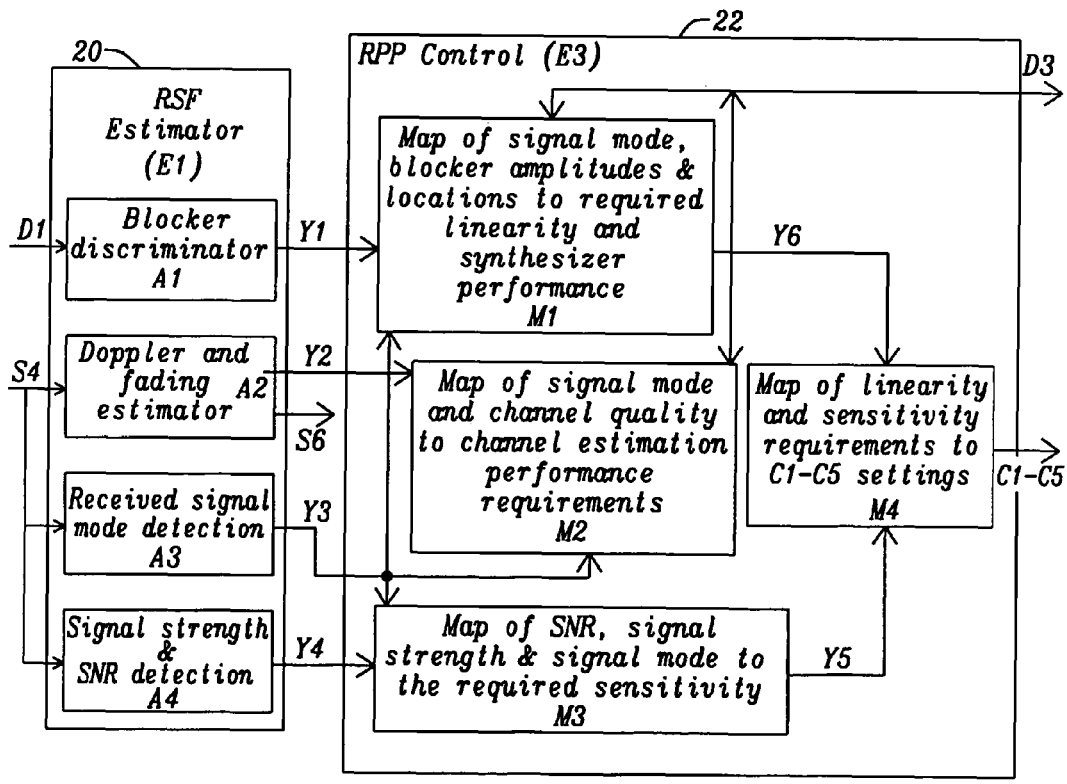
FIG. 2 is a block diagram of the Receive Signal Factors estimator and Receiver Performance Parameter control blocks according to a preferred embodiment of the present invention.

In a preferred embodiment of the present invention as shown in FIG. 2 and referring to the Receive Signal Factors estimator 20 and the Receiver Performance Parameter control 22, respectively, we describe embodiments of the Receive Signal Factors (RSF) estimator E1 and the Receiver Performance Parameter (RPP) control E3. The RSF estimator (E1) typically comprises, but is not limited to, blocks A1, A2, A3, and A4. The RPP control (E3) typically comprises, but is not limited to, blocks M1, M2, M3 and M4.

Referring to Receive Signal Factors estimator 20, Blocker discriminator A1 receives signal D1 from Signal Strength Detectors block E4, as already mentioned above. Blocker discriminator A1 produces signal Y1. Digital signal S4 from analog-to-digital converter (ADC) L4 is received (named "received signal") by: Doppler and Fading estimator A2, Received Signal Mode detection A3, and Signal Strength and SNR detection A4. A2 generates signals Y2 and S6. A3 generates signal Y3 and A4 generates signal Y4. Signals Y1, Y2, Y3, and Y4 are part of signal bus D2.

Referring to Receiver Performance Parameter control 22 and blocks M1, M2, M3, and M4.

M1 receives signals Y1 and Y3 from A1 and A3, respectively, and is coupled to M2, to M4 via signal Y6 and via 2-way signal D3 to Demodulator E2. M1 is a map of signal mode, blocker amplitudes & locations to required linearity and synthesizer performance.

M2 receives signals Y2 and Y3 from A2 and A3, respectively, and is coupled to M1 as already mentioned. M2 is a map of signal mode and channel quality to channel estimation performance requirements.

M3 receives signal Y3 and Y4 from A3 and A4, respectively, and sends signal Y5 to M4. M3 is a map of SNR, signal strength and signal mode to the required sensitivity, i.e. of how sensitivity of the receiver varies with the power control of blocks L1-L4.

M4 receives signals Y5 and Y6 from M3 and M1, respectively, and generates block control signals C1 to C5. M4 is a map of linearity and sensitivity requirements to signal C1 to C5 settings.

Providing a more detailed description we again refer to FIGS. 1 and 2. F1 comprises blocks L1, L2, L3, L4 and L5 and represents the receiver front end signal path of a receiver connected to antenna A1. Block L5 represents a frequency synthesizer block. In a direct conversion receiver, it generates a local oscillator (LO) signal S5 at a frequency $f_{LO}$ which is the same frequency ($f_{rf}$) as the desired signal, and sends the signal to the mixer (L2) which downconverts the desired signal to baseband (zero-IF) to facilitate filtering and demodulation. This invention is of course not restricted to direct conversion receiver architectures but is shown here, by way of illustration and not of limitation. Signals S1, S2, S3 and S4 are sent to a Signal Strength Detectors block E4 which passes signal strength information via signal D1 to block A1 of RSF estimator E1. The information contained in signal D1 is used by A1 to calculate the frequency location and amplitude of interfering signals (blockers). A1 sends this frequency location and amplitude information via signal Y1 to block M1 of the RPP control (E3), which uses this information to adjust the power consumption of the blocks in Receiver Front End F1 through signals C1-C5.

When strong undesired signals ("blockers"), i.e. interfering signals, are present at frequencies close to the desired signal's frequency, more linearity is required. This can be achieved by increasing power to the system at certain locations in the signal path such as the mixer L2, low-noise amplifier L1 or baseband amplifiers L3. The sensitivity of the system to these blockers is dependent on several factors:

1. Frequency locations of the blocker signals and their signal strengths.

This is conveyed in signal Y1 from block A1, the Blocker discriminator.

2. The modulation scheme and coding present in the desired signal (i.e. the mode of the system).

This is conveyed in signal Y3 from block A3, the Received Signal Mode detection, which detects important characteristics in the received signal such as modulation order OFDM or 16QAM, the type of coding scheme used, such as convolutional coding or rate 2/3.

A second consideration is the phase noise of the system, which is typically limited by synthesizer L5. In the absence of blockers, the phase noise of L5 is typically optimized for other constraints like the total integrated phase noise, to improve received signal quality. In the presence of blockers, the level of the phase noise produced by synthesizer L5 far from $f_{LO}$ needs to be reduced to eliminate the well-known problem of reciprocal mixing. Existing receivers do not control phase noise in response to blocker location. This invention introduces the following algorithm innovations:

1. The system adjusts the raw phase noise of synthesizer L5 in response to blocker levels and locations by, for example, adjusting VCO bias and swing using techniques known by those skilled in the art.
2. The system also can exercise the tradeoff of making phase noise close to $f_{LO}$ worse in order to improve phase noise far from $f_{LO}$. This can be achieved by adjusting the component values or bias levels in parts of synthesizer L5 in order to change the bandwidth of the loop filter in L5 in a manner well known by those skilled in the art of this field.

2. Determining Receiver Performance Settings

Figure 3A:
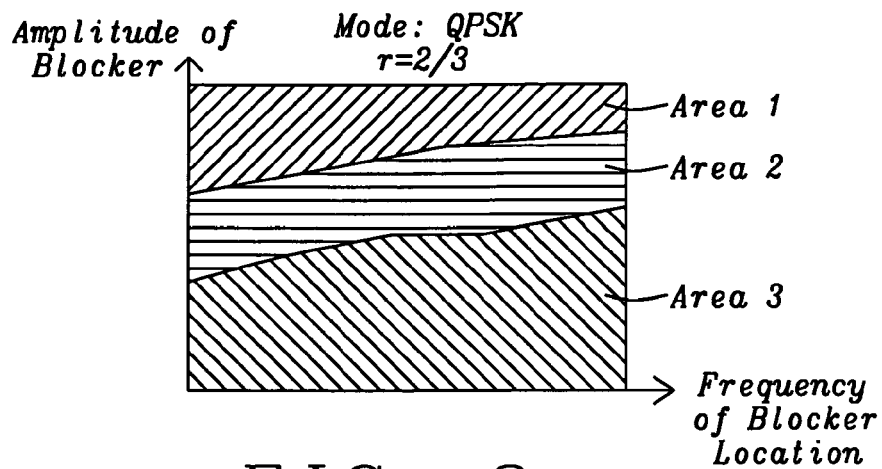
FIG. 3a is a graph illustrating the computation for Mode QPSK of the present invention.
Figure 3B:
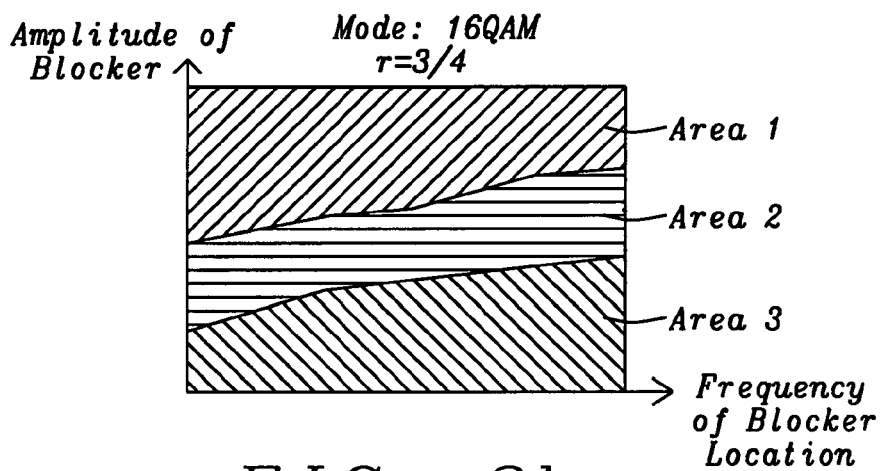
FIG. 3b is a graph illustrating the computation for Mode 16QAM of the present invention.

We now refer to FIG. 3a and FIG. 3b, which are graphs illustrating examples of the computations performed in M1 for the signal path. Similar graphs exist for the synthesizer including VCO. These graphs may be implemented using an LUT or a mathematical model. The horizontal axis gives the frequency of the blocker location, the vertical axis is a measure of the amplitude of the blocker. High power is Area 1, medium power is Area 2, and low power is Area 3.

Block M1 contains the algorithm that determines how to set the phase noise and linearity of the receiver front end given locations and levels of the blocker, and the modulation and coding scheme of the received signal, as discussed above. It feeds this setting requirement to block M4 by signal Y6. FIG. 3a and FIG. 3b illustrate the computations that M1 implements; the example used has two modes: QPSK rate 2/3 for FIG. 3a, and 16QAM rate 3/4 for FIG. 3b. Theses graphs can be implemented using a look-up-table (LUT) or using equations based on a mathematical model of the receiver.

Figure 4:
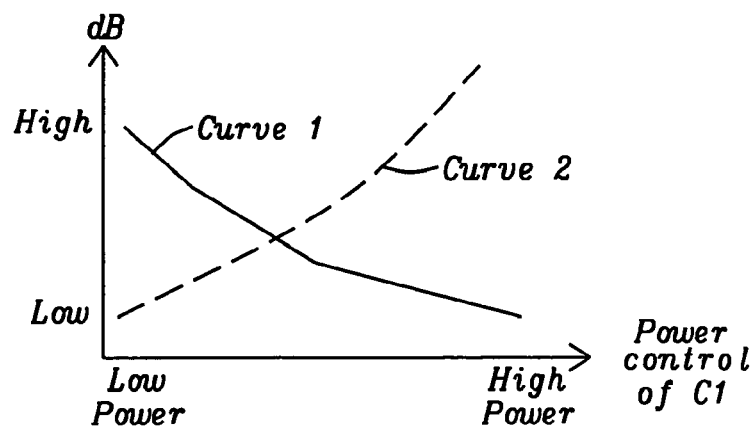
FIG. 4 is a graph illustrating the function of M4 of the present invention.

Block A4 estimates the signal strength and signal to noise ratio (using well-known techniques such as signal strength detectors, or calculating and averaging the error vector magnitude of the received signal), and feeds this information to Block M3. FIG. 4 is a graph illustrating an embodiment of the computations performed in M4, for one particular block control signal C1. Each block has its own graph. This may be implemented using an LUT or a mathematical model, or by feedback mechanisms from the receiver. The origin of the horizontal axis is Low power, High power is to the right. The vertical axis displays the signal strength in dB, where Low signal strength is at the origin and High signal strength is at the top. Curve 1 is a graph of the Noise figure, Curve 2 is a graph of the Linearity.

In one preferred embodiment, M3 receives the system BER/PER received from signal D3 and sends signal Y5 to M4 to reduce the power in all blocks fed by block control signal Ci (C1 to C5) until a target system BER/PER is achieved. In this embodiment M3 is a simple feedback controller.

Signals C1-C5 control the noise figure, linearity, maximum signal swing, and phase noise of blocks L1-L5. Block M4 obtains the required phase noise and linearity settings as well as the required SNR level and maps these (by a look-up table, for example) to actual block control signal settings C1-C5, which control blocks L1-L5.

3. Doppler and Fading Conditions

Figure 5:
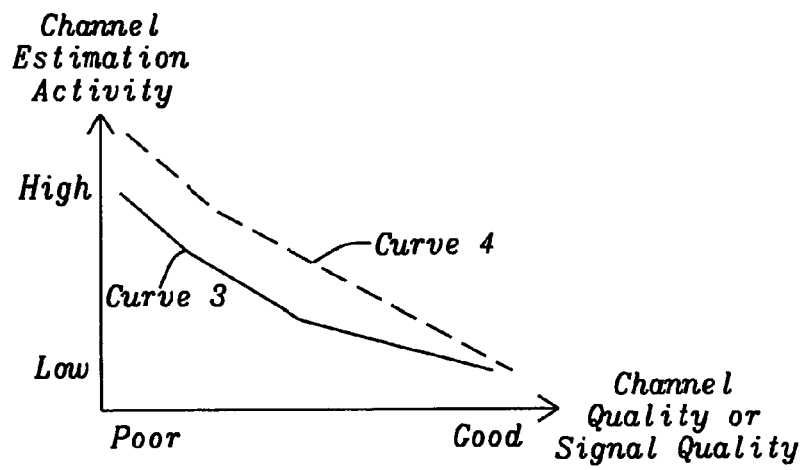
FIG. 5 is a graph illustrating the computation performed in M2 of a preferred embodiment of the present invention.

We next refer to FIG. 5, which is a graph illustrating an embodiment of the computations performed in M2. This may be implemented using an LUT or a mathematical model. The horizontal axis indicates the Channel quality or Signal quality from Poor at the origin of the axis to Good at the right, the vertical axis is a measure of the Channel Estimation Activity starting from Low at the origin of the axis to High at the top. Mode: QPSK r=2/3 is represented by Curve 3, Mode: 16QAM rate 3/4 is represented by Curve 4.

In the reception of wireless signals in a mobile environment, it is desirable to include signal processing in the receiver, which counteracts the effects of the changing channel conditions. The rate at which these changes occur is technically referred to as the Doppler frequency. Block A2 takes the received signal and estimates the Doppler frequency of the signal. Block M2 uses this estimate Y2 together with modulation and coding scheme Y3, and an estimate of the signal quality such as can be obtained from commonly-available SNR estimators (signal Y4) or the BER/PER (via D3) from the demodulator to determine how frequently to perform functions such as updating channel estimation or equalization which consume power. This allows the system to reduce power consumption of the demodulator block E2 under low Doppler conditions, when the wireless channel is changing at a slow rate.

4. Bit Error Rate (BER)/Packet Error Rate (PER)

In a preferred embodiment of the present invention, BER/PER (transmitted from the Demodulator E2 to the RPP control E3 via D3) is used in the following manner:

1. To gauge of how much excess performance the system has over and above the minimum required performance is the bit error rate or packet error rate of the system.
   i. If BER/PER is well below the system target level for a certain grade of performance, the receiver performance parameters can be adjusted to trade off BER/PER.
2. As a feedback mechanism during the adjustment of the RPP Control.
   i. If BER/PER is poor, E3 can combine BER/PER information together with blocker detection to adjust signals C1-C5 in a manner to minimize the BER/PER under the given channel conditions.
   ii. It achieves this BER/PER minimization using any number of standard search techniques that are already available.

5. Summary

Figure 6:
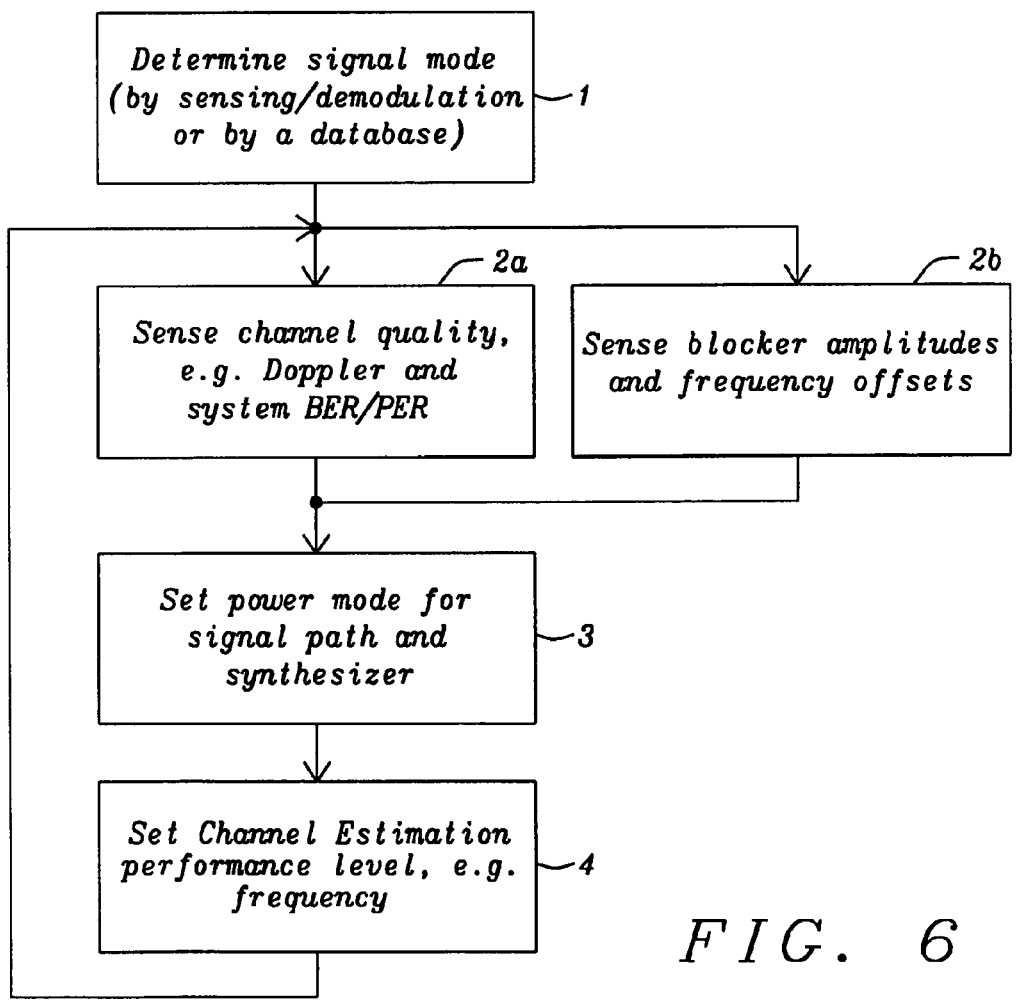
FIG. 6 is a flowchart illustrating the general operation of a preferred embodiment the present invention.

FIG. 6 is an overall flowchart illustrating the general operation of a preferred embodiment of the present invention:

Block 1 determines the signal mode by sensing/demodulation or by a database;
Block 2a senses the channel quality, for example Doppler and system BER/PER;
Block 2b senses blocker amplitudes and frequency offsets;
Block 3 sets the power mode for the signal path and synthesizer;
Block 4 sets the Channel Estimation performance level, for example the frequency.
The output of Block 4 feeds back to Blocks 2a and 2b.

Figure 7:
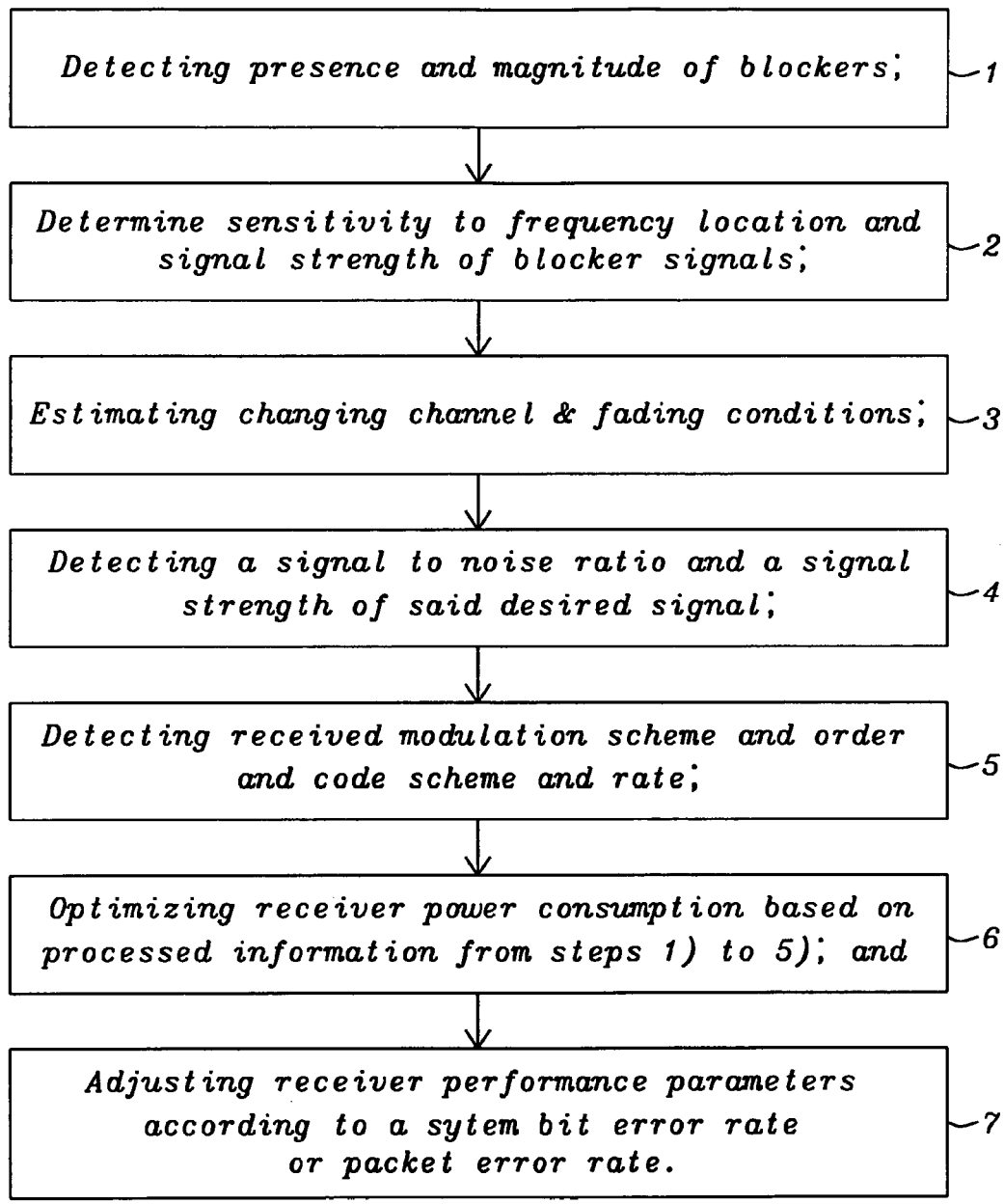
FIG. 7 is a block diagram of a first method of the present invention.

We now describe a first method of optimizing receiver power consumption of the preferred embodiment of the present invention with reference to the block diagram of FIG. 7:
Block 1 detects the presence and magnitude of blockers;
Block 2 determines the sensitivity to frequency location and signal strength of blocker signals;
Block 3 estimates the changing channel and fading conditions;
Block 4 detects the signal to noise ratio and a signal strength of said desired signal;
Block 5 detects the received modulation scheme and order and coding scheme and code rate;
Block 6 optimizes the receiver power consumption based on processed information from steps 1) to 5); and;
Block 7 adjusts the receiver performance parameters according to a system bit error rate or packet error rate.

Figure 8:
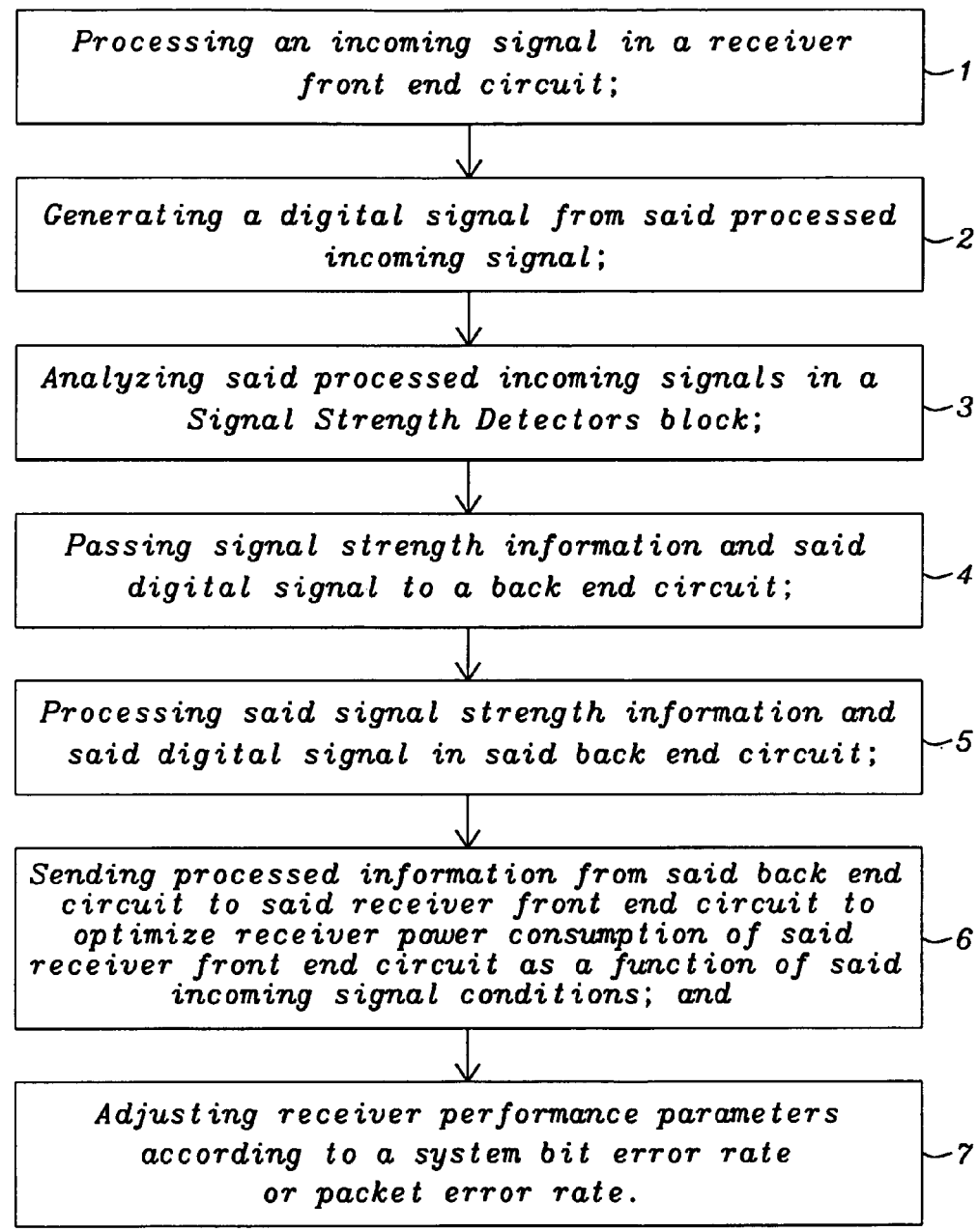
FIG. 8 is a block diagram of a second method of the present invention.

Next we describe a second method of optimizing receiver power consumption of the preferred embodiment of the present invention with reference to the block diagram of FIG. 8:
Block 1 processes the incoming signal in a receiver front end circuit;
Block 2 generates a digital signal from said processed incoming signal;
Block 3 analyzes the processed incoming signals in a Signal Strength Detectors block;
Block 4 passes signal strength information and said digital signal to a back end circuit;
Block 5 processes the signal strength information and said digital signal in said back end circuit;
Block 6 sends processed information from said back end circuit to said receiver front end circuit to optimize receiver power consumption of said receiver front end circuit as a function of said incoming signal conditions; and
Block 7 adjusts receiver performance parameters according to a system bit error rate or packet error rate.

While the invention has been particularly shown and described with reference to the preferred embodiments thereof, it will be understood by those skilled in the art that various changes in form and details may be made without departing from the spirit and scope of the invention.

What is claimed is:

1. A system for power control, the system comprising:
   a detector operable to generate a signal strength indication according to one or more signals from a receiver, wherein the detector is operable to estimate a Doppler frequency according to the one or more signals from the receiver;
   an estimator operable to estimate a frequency and an amplitude of an interferer according to the signal strength indication; and
   a controller operable to generate one or more control signals according to one or both of the frequency and the amplitude of the interferer, wherein the one or more control signals adjust power consumption in the receiver, and how frequently the one or more control signals are updated is based on said estimated Doppler frequency.

2. The system of claim 1, wherein the receiver comprises an amplifier, a frequency synthesizer, a mixer and an analog-to-digital converter.

3. The system of claim 2, wherein the detector receives the one or more signals from one or more of the amplifier, the frequency synthesizer, the mixer and the analog-to-digital converter.

4. The system of claim 2, wherein the controller is operable to adjust the frequency synthesizer.

5. The system of claim 1, wherein the receiver is operable to receive and process an incoming signal from a communication channel in a plurality of circuits to generate the one or more signals, thereby enabling an estimation of a communication channel quality.

6. The system of claim 1, wherein the detector is operable to estimate a signal to noise ratio according to the one or more signals from the receiver.

7. The system of claim 1, wherein the controller is operable to adjust the linearity of the receiver.

8. The system of claim 1, wherein the controller is operable to adjust the phase noise of the receiver.

9. A method for power control, the method comprising:
   generating a signal strength indication according to one or more signals from a receiver;
   estimating a frequency and an amplitude of an interferer according to the signal strength indication;
   estimating a Doppler frequency according to the one or more signals from the receiver;
   generating one or more control signals according to one or both of the frequency and the amplitude of the interferer; and
   adjusting power consumption in the receiver according to at least one of the one or more control signals, wherein the frequency of said adjusting is based on said estimated Doppler frequency.

10. The method of claim 9, wherein the receiver comprises an amplifier, a frequency synthesizer, a mixer and an analog-to-digital converter.

11. The method of claim 10, wherein method comprises receiving the one or more signals from one or more of the amplifier, the frequency synthesizer, the mixer and the analog-to-digital converter.

12. The method of claim 10, wherein the method comprises adjusting the frequency synthesizer according to one or both of the frequency and the amplitude of the interferer.

13. The method of claim 9, wherein the method comprises processing an incoming signal from a communication channel in a plurality of circuits to generate the one or more signals, thereby enabling an estimation of a communication channel quality.

14. The method of claim 9, wherein the method comprises estimating a signal to noise ratio according to the one or more signals from the receiver.

15. The method of claim 9, wherein the method comprises adjusting the linearity of the receiver according to at least one of the one or more control signals.

16. The method of claim 9, wherein the method comprises adjusting the phase noise of the receiver according to at least one of the one or more control signals.

* * * * *